(12) United States Patent
Ziari et al.

(10) Patent No.: US 6,758,610 B2
(45) Date of Patent: Jul. 6, 2004

(54) OPTICAL COMPONENT ATTACHMENT TO OPTOELECTRONIC PACKAGES

(75) Inventors: Mehrdad Ziari, Pleasanton, CA (US); Robert J. Lang, Alamo, CA (US); Tanya K. Oleskevich, Victoria, CA (US); Vivek Agrawal, Santa Clara, CA (US); Ashok P. Kanjamala, Santa Clara, CA (US); Donald C. Hargreaves, Sidney (CA); Harrison L. Ransom, Antioch, CA (US); David Dawson, Livermore, CA (US); Radhakrishnan L. Nagarajan, Cupertino, CA (US)

(73) Assignee: JDS Uniphase Corporation, San Jose, CA (US)

( * ) Notice: Subject to any disclaimer, the term of this patent is extended or adjusted under 35 U.S.C. 154(b) by 101 days.

(21) Appl. No.: 10/016,473

(22) Filed: Dec. 10, 2001

(65) Prior Publication Data

US 2003/0108304 A1 Jun. 12, 2003

(51) Int. Cl.⁷ .................................................. G02B 6/42
(52) U.S. Cl. .......................................... 385/92; 385/88
(58) Field of Search .............................. 385/88, 76, 77, 385/90–94; 438/22, 26, 27–29, 31; 257/79–82

(56) References Cited

U.S. PATENT DOCUMENTS

| | | | |
|---|---|---|---|
| 4,523,802 A | * | 6/1985 | Sakaguchi et al. ............. 385/91 |
| 4,702,547 A | | 10/1987 | Enochs |
| 4,708,429 A | | 11/1987 | Clark et al. |
| 4,798,439 A | | 1/1989 | Preston |
| 4,854,667 A | | 8/1989 | Ebata et al. |
| 4,970,365 A | | 11/1990 | Chalco |
| 4,971,418 A | | 11/1990 | Dorsey et al. |
| 4,984,866 A | | 1/1991 | Boisgontier et al. |
| 4,997,253 A | | 3/1991 | Enochs |
| 5,272,310 A | | 12/1993 | Daikuzono |
| 5,307,434 A | | 4/1994 | Blonder et al. |
| 5,359,686 A | | 10/1994 | Galloway et al. |
| 5,367,140 A | | 11/1994 | Jouaneh et al. |
| 5,469,456 A | | 11/1995 | Rogers et al. |
| 5,568,892 A | | 10/1996 | Basavanhally |
| 5,622,788 A | | 4/1997 | Gates, II et al. |
| 5,700,987 A | | 12/1997 | Basavanhally |
| 5,780,875 A | | 7/1998 | Tsuji et al. |
| 6,074,103 A | | 6/2000 | Hargreaves et al. |
| 6,205,264 B1 | * | 3/2001 | Jin et al. ...................... 385/14 |
| 6,271,049 B1 | * | 8/2001 | Auracher et al. ............. 438/29 |

OTHER PUBLICATIONS

Krista McEuen, Industrial Laser Review, "Diode lasers solve soldering problems", Feb. 1998, p. 16–18.

* cited by examiner

Primary Examiner—Jay Patidar
(74) Attorney, Agent, or Firm—Allen, Dyer, Doppelt, Milbrath & Gilchrist, P.A.

(57) ABSTRACT

An optical connection module attaches an active or passive optical component to a substrate and aligns the optical component with a first laser. The optical connection module includes a fiber submount that is attached to the substrate and that includes a thermally insulating material having a thickness greater than 20 micrometers. The optical component is soldered to the fiber submount using heat from a second laser. A laser submount is attached to the substrate. The first laser is attached to the laser submount. A fiber bonding pad is located between the thermally insulating material and the optical component. The thermally insulating material and the fiber bonding pad promote lateral heat transfer and limit vertical heat transfer to the substrate during soldering. The thermally insulating material can be integrally formed in the substrate by flame hydrolysis or by anodic bonding.

54 Claims, 9 Drawing Sheets

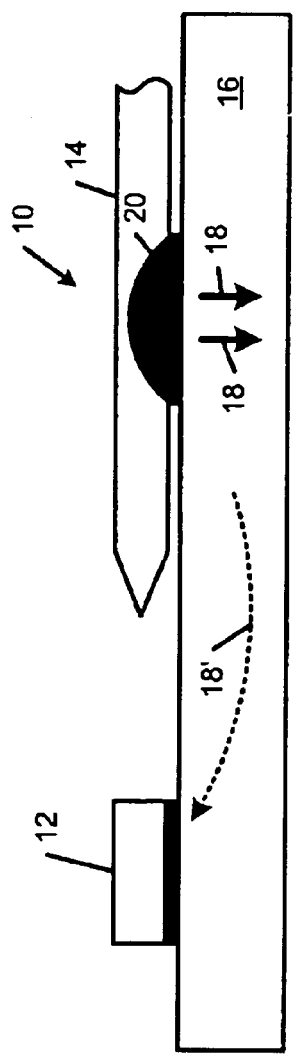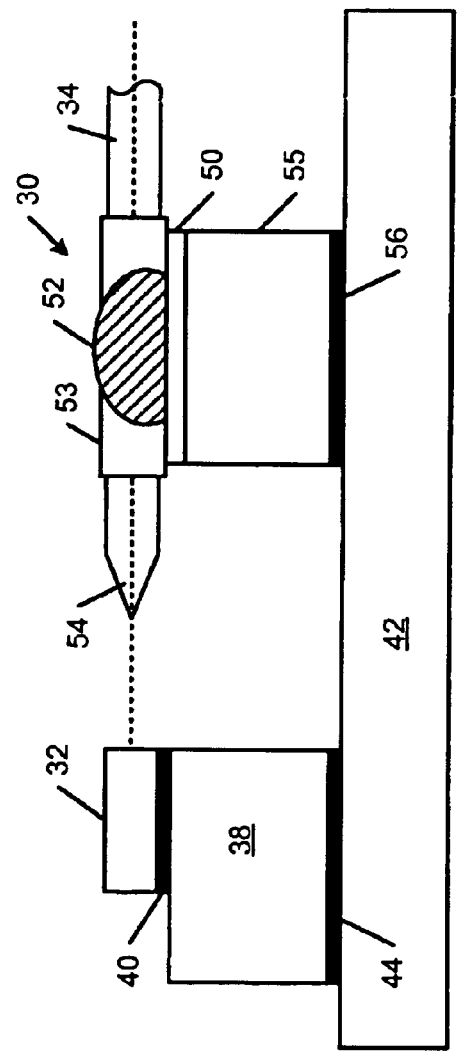

OPTICAL COMPONENT ATTACHMENT TO OPTOELECTRONIC PACKAGES

GOVERNMENT INTEREST

The Government has rights in this invention pursuant to government contract DAAH01-96-C-R083 awarded by DARPA.

FIELD OF THE INVENTION

The present invention relates to optical fibers, and more particularly to the attachment of optical components to a substrate and to the alignment of the optical component to a laser.

BACKGROUND OF THE INVENTION

There is a significant and growing demand in the optoelectronics industry for low cost fiber-coupled laser modules that are highly reliable. Fiber-coupled laser modules include an optical fiber that is aligned with a laser on a substrate and that is attached to the substrate. Single mode fiber devices require fiber-coupled laser modules. For example, fiber-coupled laser modules are used in pumps for fiber amplifiers, wavelength division multiplex (WDM) sources, high-speed and high-power distributed feedback (DFB) lasers, and semiconductor optical amplifiers.

Generally, the laser and the optical fiber are fabricated or mounted on a substrate. To achieve acceptable performance, the optical fiber must be precisely aligned to the laser. After alignment, the optical fiber must be securely attached to the substrate without adversely impacting alignment, damaging the laser or the optical fiber, or turning the laser off. Proper alignment ensures that the optical interface has a very high single mode coupling efficiency. The connection between the optical fiber and the substrate must also be capable of withstanding environmental conditions such as operating temperature variations, vibration, dust, etc. Other important attributes include a relatively high thermal conductivity between the laser and the substrate to allow high power operation of the laser.

The high thermal conductivity between the laser and the substrate may cause problems when connecting the optical fiber to the substrate using attachment methods that employ heat. For example, soldering is often used to attach the optical fiber to the substrate. Soldering involves heating the metallic parts that are to be connected together and using solder to bind the parts together. Oftentimes, an integrated resistor that is in a heat exchange relationship with the solder is used as a heat source for melting the solder.

Referring now to FIG. 1, a fiber-coupled laser module 10 according to the prior art includes a laser 12 and an optical fiber 14 that are attached to a substrate 16. Heat (identified by arrows 18) is generated during attachment of the optical fiber 14 to the substrate 16 using solder 20. Most of the heat 18 from the soldering operation tends to flow downward through the substrate 16 to a heatsink (not shown) such as a thermoelectric cooler (TEC). Due to the relatively high thermal conductivity of the path between the laser 12 and the substrate 16, some of the heat 18' is also conducted to the laser 12. The heat 18' may damage the diode or melt the solder that connects the laser 12 to the substrate 16, which decreases the reliability of the laser 12 and increases degradation of the solder connection. The heat 18' can also cause misalignment of the laser 12 and/or turn off the laser 12 during alignment.

SUMMARY OF THE INVENTION

An optical connection module according to the invention attaches an optical component to a substrate and aligns the optical component to a laser. The optical connection module includes a fiber submount that is attached to the substrate and a thermally insulating material having a thickness greater than 20 micrometers. An optical component is soldered to the fiber submount by application of heat from a laser. A laser submount is attached to the substrate. A laser is attached to the laser submount.

In other features of the invention, the optical component is selected from active and passive optical components such as optical fiber, lenses, mirrors, filters, detectors, isolators, and microelectromechanical devices.

In still other features of the invention, a fiber bonding pad is located between the solder and the thermally insulating material. The fiber bonding pad has a lateral heat flow characteristic that is significantly greater than its vertical heat flow characteristic. The fiber bonding pad is located between the thermally insulating material and the optical fiber. The fiber bonding pad and the thermally insulating material conduct heat locally and laterally during laser soldering to uniformly melt the solder. The thermally insulating material and the fiber bonding pad limit heat transfer to the substrate during soldering. The fiber bonding pad also provides a robust attachment location for connecting the optical component. The thickness of the fiber bonding pad also helps conduct heat laterally. The fiber bonding pad also provides a solder dam.

In yet other features of the invention, the fiber bonding pad includes multiple layers. One layer is made of Au and another layer is selected from the group of Ni, Cr, Ti and CrO. Additional layers can be made of Ti and Pt.

In another feature of the invention, an integrated fiber-coupled laser module for aligning and attaching an optical fiber to a substrate includes a thermally insulating material formed integrally in the substrate and having a thickness greater than 20 micrometers. A fiber bonding pad includes at least one metallic layer attached to the thermally insulating material. An optical fiber is laser soldered to the fiber bonding pad. A laser is located on the substrate.

In still other features of the invention, the integrated thermally insulating material is formed by flame hydrolysis or by anodic bonding.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1 illustrates a fiber-coupled laser module with a laser and an optical fiber that are aligned and attached to a substrate according to the prior art;

FIG. 2 illustrates an optical connection module with a laser and an optical component such as an optical fiber that are attached to a substrate according to the present invention;

DETAILED DESCRIPTION OF THE PREFERRED EMBODIMENTS

Figure 4:
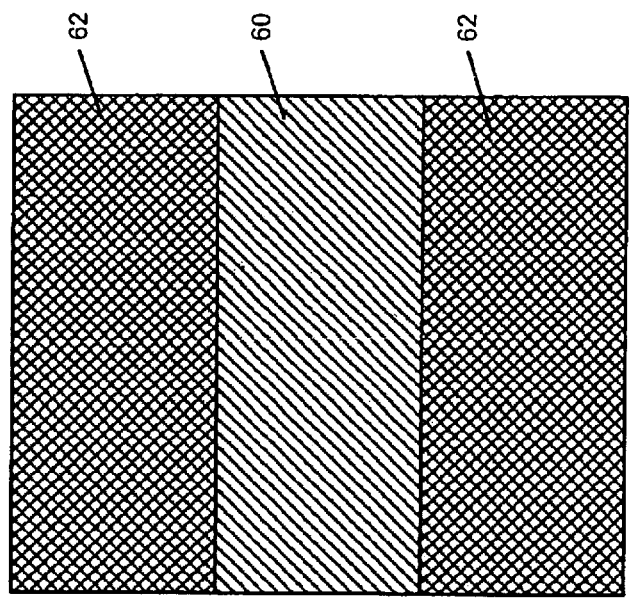
FIG. 4 is a plan view that illustrates part of the fiber bonding pad.

The following description of the preferred embodiment(s) is merely exemplary in nature and is in no way intended to limit the invention, its application, or uses.

The present invention discloses apparatus and an improved method for attaching an optical component to a substrate aligning the optical component to a laser. Skilled artisans will appreciate that the present invention can be employed to attach active and passive optical components such as optical fiber, mirrors, lenses, detectors, microelectromechanical (MEMS) devices, isolators and other optical components to a substrate without causing damage to the laser due to heat.

Referring now to FIG. 2, the present invention will be described in the context of an optical connection module 30 for an optical fiber. Skilled artisans will appreciate that the present invention applies to the attachment and the alignment of other active and passive optical components. A laser 32 is attached to a laser submount 38 by a bonding region 40. The laser submount 38 is connected to a substrate 42 by a bonding region 44. An optical fiber 34 is attached to a fiber bonding pad 50 by solder 52. The fiber bonding pad 50 can include one or more layers. At least one of the layers is preferably metallic.

The optical fiber 34 preferably has a metallic outer layer 53 along a portion of the optical fiber 34 for bonding with the solder 52. Alternately, the metallic outer layer 53 can be omitted and the solder can be flowed completely around the optical fiber 34 to attach the optical fiber 34 to the fiber bonding pad 50. Suitable metallic outer layers 53 may be NiAu and other similar metallic layers. An end of the optical fiber 34 may include a lensed surface 54 to increase the coupling efficiency of the optical fiber 34. The fiber bonding pad 50 is attached to a fiber submount 55. The fiber submount 55 is attached by a bonding region 56 to the substrate 42.

The solder 52 preferably has a relatively high melting temperature such as 250° C. or higher. Preferably, the solder is eutectic and hard with minimal creep at room temperature. Creep is a function of activation energy that is typically related to the melting temperature of the solder. In other words, a high melting temperature generally corresponds to high activation energy. Minimizing creep helps maintain alignment in use. For example, the solder can be AuSn and have a melting temperature of 284° C. Composition percentages such as 80%—Au and 20%—Sn or other compositions are also contemplated. Other suitable solder materials include PbSn and AuGe. The fiber submount 55 is preferably made of a thermally insulating material. For example, the thermally insulating material can be glass (silicon dioxide (SiO$_2$)), ceramic such as Micor, Zirconia or M120, or any other similar thermally insulating material.

The path between the laser 32 and the substrate 42 preferably has a relatively high thermal conductivity. In other words, the laser submount 38 and the bonding regions 40 and 44 have a relatively high thermal conductivity to minimize the laser junction temperature during operation and to improve the power, efficiency and reliability. For example, the laser submount 38 is preferably formed from CuW, AlN, SiC, BeO, Si, TcBN, or diamond. The bonding regions 40 and 44 preferably include solder such as AuSn with 80% Au and 20% Sn (other compositions and percentages are also contemplated).

Figure 3:
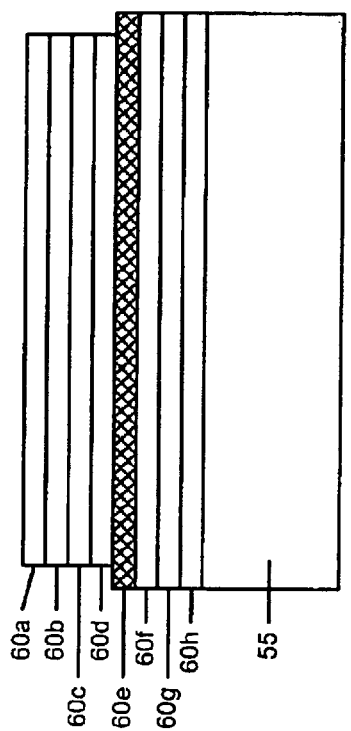
FIG. 3 is a side cross-section that illustrates a fiber bonding pad that is located between the optical component and an insulating fiber submount.

Referring now to FIG. 3, a preferred embodiment of the fiber bonding pad 50 and fiber submount 55 is shown in further detail. The fiber bonding pad 50 includes one or more layers and provides lateral heat conduction to adequately conduct heat to the solder 52 during laser soldering. The fiber submount 55 limits vertical heat conduction to prevent heat flow through the fiber bonding pad 50 and the fiber submount 55 to the substrate 42 and the laser 32. The fiber bonding pad 50 also provides a solder dam, absorbs laser light, increases robustness of the attachment region and/or fosters lateral heat conduction.

In one embodiment, the fiber bonding pad 50 includes layers 60a through 60h. Layer 60a provides a solder wetting layer and is preferably made of Au or other similar materials. Layer 60b provides a solder barrier and is preferably made of Pt or other similar materials. Layer 60c provides a mechanical support and is preferably made of Ni or other similar materials. Layer 60d provides an adhesion between layers 60c and 60e and is preferably made of Ti or other similar materials. Layer 60e provides for absorption of the incident laser light, acts as a solder barrier and is preferably made of Ti or other similar materials. Layer 60f provides for lateral conduction of heat and is preferably made of Ni or other similar materials. Layer 60g provides an adhesion between layers 60f and 60h and is preferably made of Ti or other similar materials. Layer 60h provides for lateral conduction and adhesion to fiber submount 55 and is preferably made of Ni-ceramic composite or other similar materials.

Figure 5:
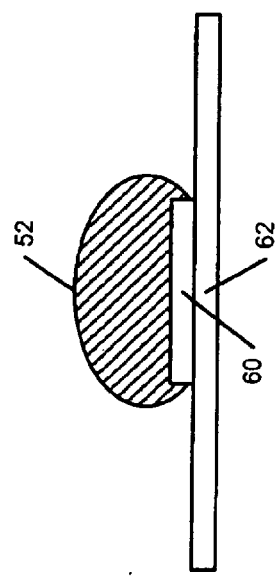
FIG. 5 is an end cross-section that illustrates the solder and part of the fiber bonding pad.

The fiber bonding pad 50 provides a robust attachment point to the fiber mount and a solder barrier. The fiber bonding pad 50 also should allow lateral heat conduction through the thickness of the layer(s) provided by the fiber bonding pad 50. As can be appreciated, there are many variations that may be readily apparent to those skilled in the art, including removal of one or more of the layers, the addition of other layers, and/or substitution of layers with similar properties. FIG. 4 illustrates a plan view the fiber bonding pad 50. FIG. 5 illustrates a cross-sectional view of the solder 52 and the fiber bonding pad 50. For simplicity, the top portion of the fiber bonding pad 50, including layers 60a, 60b, 60c, and 60d, is labeled as 60, while the lower portion of the fiber bonding pad 50, including layers 60e, 60f, 60g, and 60h, is labeled as 62.

Figure 6A:
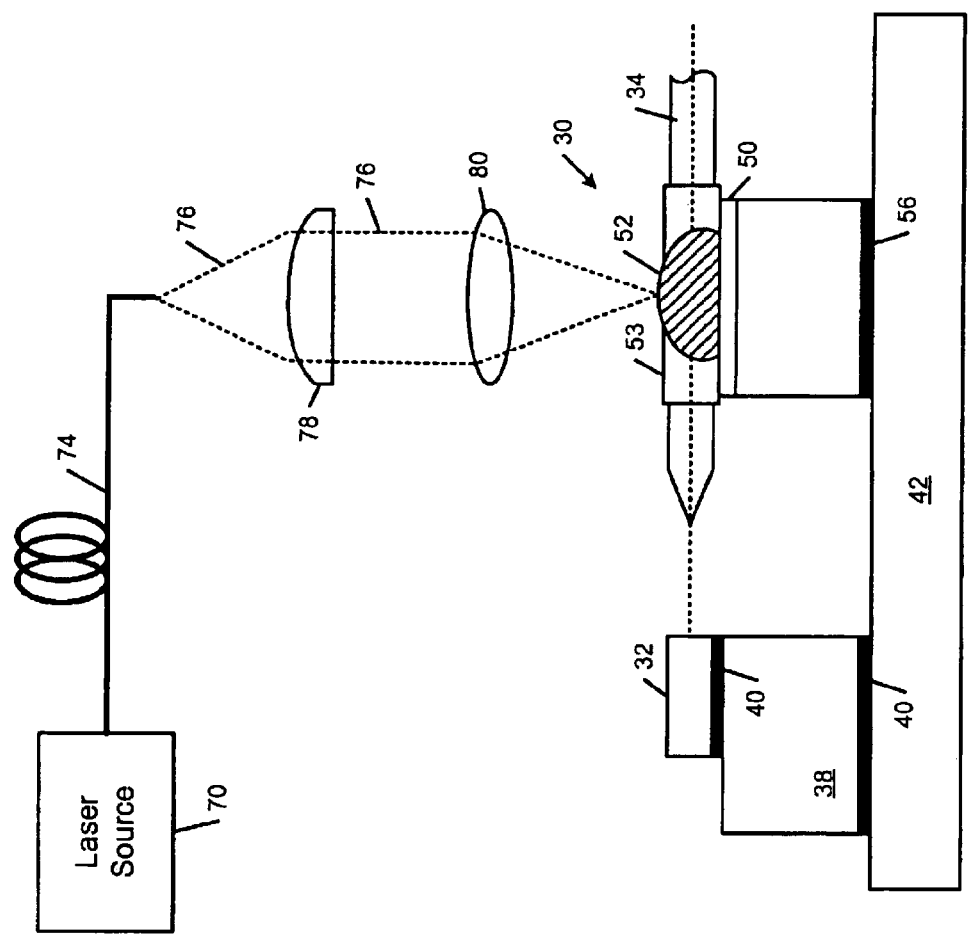
FIGS. 6A and 6B illustrate the optical connection module of FIG. 2 and exemplary laser soldering systems.
Figure 6B:
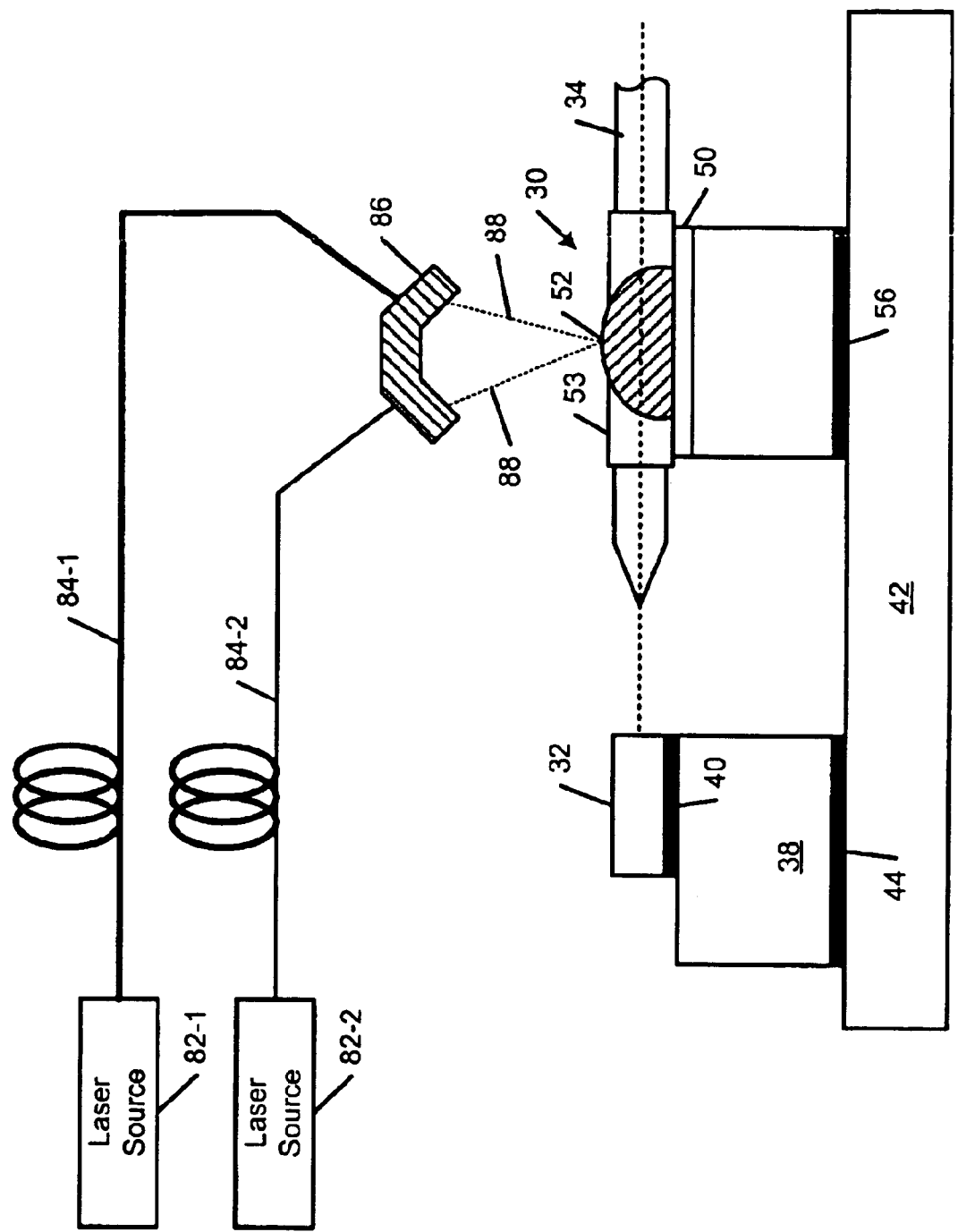

Referring now to FIG. 6A, the solder 52 is preferably melted during the alignment and attachment process using laser heating. For purposes of clarity, reference numbers from FIG. 2 are used in FIG. 6A where appropriate to identify the same elements. A laser source 70 is connected to an optical fiber 74. A beam of light 76 is output by the optical fiber 74. The beam of light 76 is collimated by a collimating lens 78 and focused by a focusing lens 80 onto the solder 52. Advantageously, the required power of the laser source 70 is relatively low, for example 1–3 Watts (W) is typically sufficient when AuSn is employed as solder 52. Initially the laser 32 and the optical fiber 34 are aligned. The beam of light 76 heats the solder 52 causing the solder 52 to melt. The beam of light 76 is turned off or directed away from the solder 52. The solder 52 cools, solidifies, and fixes the position of the optical fiber 34 relative to the laser 32. Referring now to FIG. 6B, multiple laser sources 82-1 and 82-2 are connected by optical fibers 84-1 and 84-2 to a beam delivery system 86. The beam delivery system 86 directs the beams of light 88 onto the solder 52 during the alignment and attachment process. The process of alignment may be repeated one or more times until alignment is achieved. As can be appreciated, more than two laser sources may be employed if desired.

Figure 7A:
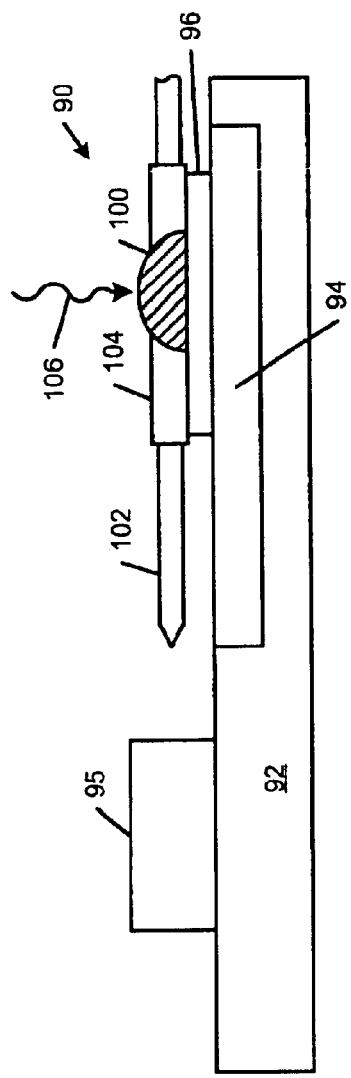
FIGS. 7A and 7B illustrate an integrated optical connection module with a laser and an optical component such as an optical fiber according to the present invention.
Figure 7B:
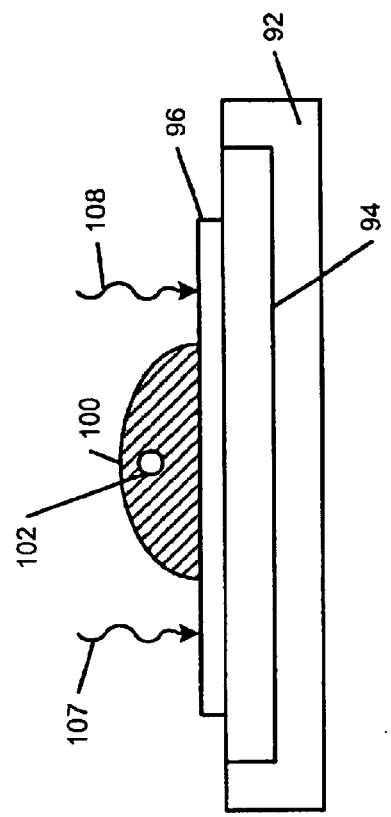

Referring now to FIGS. 7A and 7B, an integrated optical connection module 90 is shown. The integrated optical connection module 90 includes a substrate 92 and a thermally insulating material 94 that is integrated directly into the substrate 92. The substrate 92 is preferably fabricated from silicon, InP, GaAs or other suitable materials. The thermally insulating material 94 is preferably glass, ceramic, or any other suitable thermally insulating material. The thermally insulating material 94 is planar. A fiber bonding pad 96 is attached to a top surface of the thermally insulating material 94. The fiber bonding pad 96 is preferably similar in structure to the fiber bonding pad 50. A laser 95 is fabricated directly on the substrate 92 or is attached using a bonding region (not shown). Solder 100 attaches an optical fiber 102 to the fiber bonding pad 96. An optional metallic outer layer 104 (as discussed above) may be employed. A laser heats the solder 102 and/or heats the fiber bonding pad 96. In FIG. 7A, a single beam 106 of laser light heats the solder 100. In FIG. 7B, multiple beams 107 and 108 of laser light uniformly heat the fiber bonding pad 96.

Figure 8A:
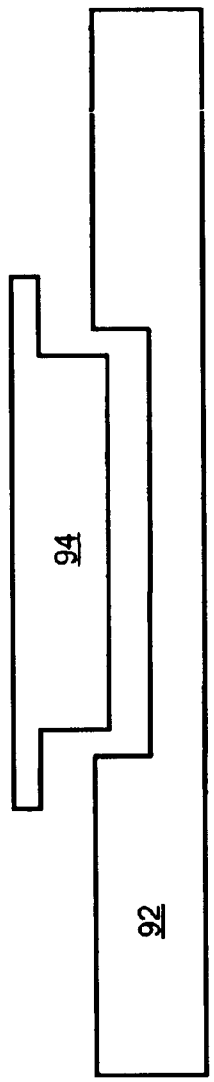
FIGS. 8A–8C illustrate a first embodiment of the integrated optical connection module of FIG. 7.
Figure 8B:
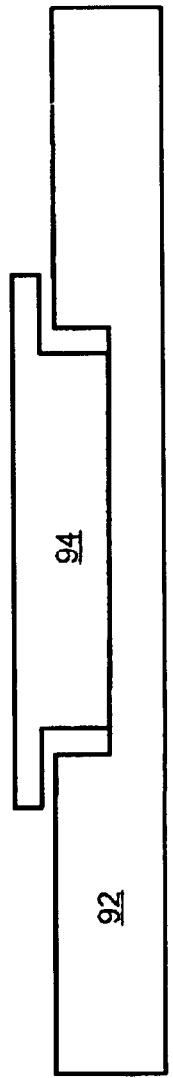
Figure 8C:
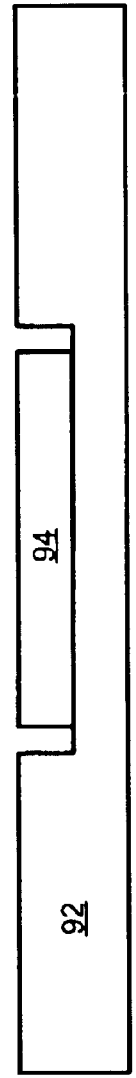

Referring now to FIGS. 8A, 8B and 8C, a first method for fabricating the relatively thick thermally insulating material 94 in the substrate 92 is shown. The substrate 92 and the thermally insulating material 94 are patterned and etched. The smoothness of the bonding surfaces of the substrate 92 and the thermally insulating material 94 should approximately match. Preferably, the material used to form the substrate 92 and the thermally insulating material have coefficients of thermal expansion (CTE) that approximately match. The substrate 92 and the thermally insulating material 94 are initially brought into contact at an elevated temperature in the presence of an electric field. An anodic bond is formed between the substrate 92 in the thermally insulating material 94 at the atomic scale. The substrate 92 and the thermally insulating material 94 are polished in FIG. 8C. As can be appreciated, the foregoing method allows the integration of the relatively thick thermally insulating material 94 with the substrate 92.

Figure 9A:
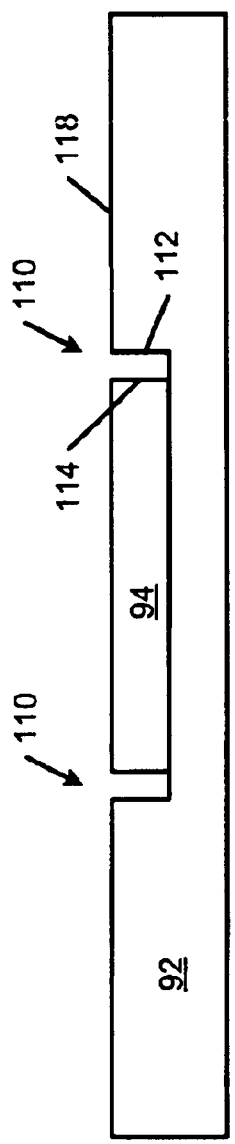
FIGS. 9A–9C illustrate the use of glass frit in lateral gaps of the first embodiment of the integrated optical connection module of FIG. 7.
Figure 9B:
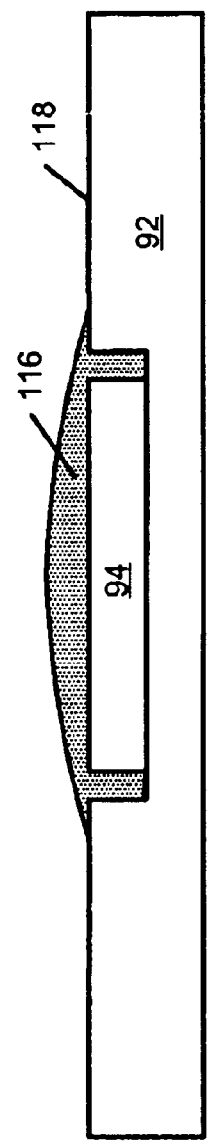
Figure 9C:
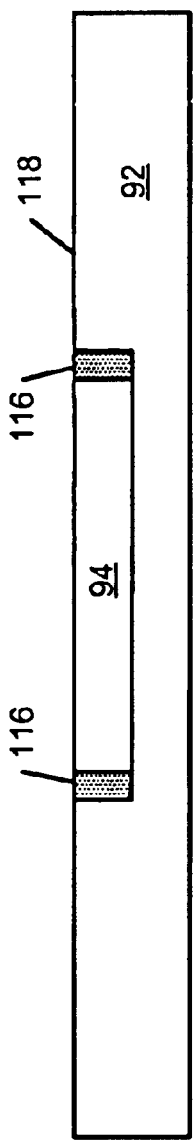

Referring now to FIGS. 9A, 9B, and 9C, additional steps for fabricating the relatively thick thermally insulating material 94 in the substrate 92 are shown. The thermally insulating material 94 and the substrate 92 have etched features or lateral gaps 110 between edges 112 of the thermally insulating material 94 and edges 114 of the substrate 92. The gaps 100 are filled with glass frit 116 in a powder form as is shown in FIG. 9B. After high-temperature annealing, the glass frit 116 solidifies into glass. A top surface 118 is polished to provide a planar, smooth surface as illustrated in FIG. 9C. Annealing is performed at temperatures in excess of 300° C.

Figure 10A:
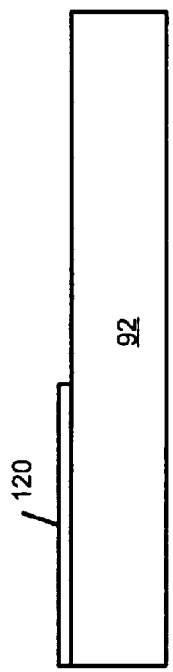
FIGS. 10A–10D illustrate a second embodiment of the integrated optical connection module of FIG. 7.
Figure 10B:
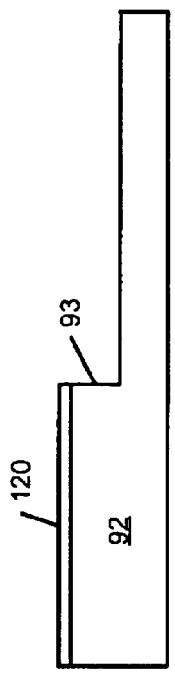
Figure 10C:
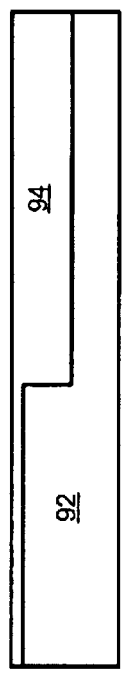

Referring now to FIGS. 10A, 10B, 10C, and 10D, a second method for fabricating the integrated fiber-coupled laser module 90 is shown. In FIG. 10A, the substrate 92 is patterned using a mask 120. In FIG. 10B, the substrate 92 is etched at 93. Preferably, reactive ion etching, chemical etching, or other suitable etching methods are employed. In FIG. 10C, the mask 120 is removed and a thermally insulating material 122 is formed by one or more flame-hydrolysis growths. Typically, 10–30 micron layers are added per growth.

Figure 10D:
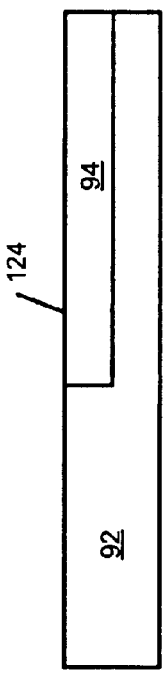

In FIG. 10D, polishing is performed to re-expose the substrate 92 in regions where previously covered by mask 120 to provide a planar, smooth top surface 124. Preferably, the materials that are selected for the substrate 92 and the thermally insulating material 94 have CTEs that approximately match. Creating the thermally insulating material 94 using flame-hydrolysis provides void-free adhesion of glass onto the substrate 92. In addition, the integrated optical connection module 90 has excellent planarity.

The thickness of the thermally insulating material 94 is preferably between 20 and 300 micrometers. The optical connection modules according to the present invention have high thermal conductivity between the laser and the substrate to enable high-power operation. The optical connection modules also have high thermal insulation between the optical fiber attachment region and the laser to minimize temperature increase of the laser during solder attachment of the optical fiber. The optical connection modules have relatively high thermal conductivity in the fiber attachment region to minimize the required heat. In addition, the optical connection modules are mechanically stable over the operating and processing temperatures. The integrated optical connection modules are planar and relatively low-cost to fabricate.

Figure 11:
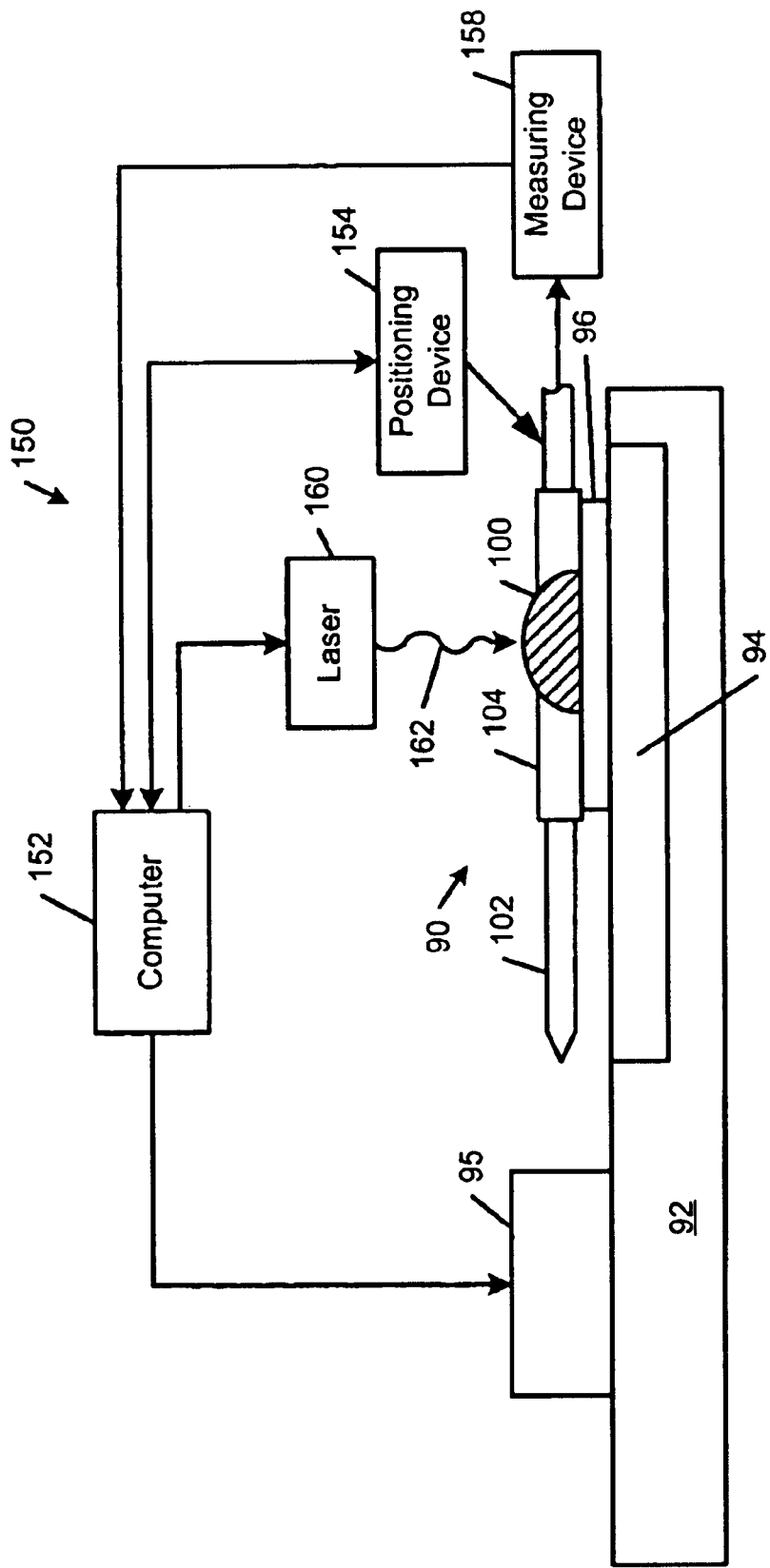
FIG. 11 illustrates optical component alignment system according to the present invention.

Referring now to FIG. 11, an optical component alignment system 150 is illustrated and includes a computer 152, a positioning device 154, and a measuring device 158. The optical component alignment system 150 is shown in conjunction with the embodiment of FIG. 7A. Skilled artisans will appreciate that the optical component alignment system 150 can be used with other embodiments disclosed herein.

A laser 160 generates one or more beams 162 of laser light that are directed at the solder 100 and/or the fiber bonding pad 96 to heat the solder. The computer 152 turns on the laser 95. The measuring device 158 generates an output signal related to the output of the optical fiber 102 or other optical component and outputs the output signal to the computer 152. The computer 152 calculates position adjustment signals that are used to adjust the position of the optical fiber 102. One or more iterations are performed until the optical fiber 102 is properly aligned with the laser 95.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An optical connection module for attaching an optical component to a substrate and aligning said optical component with a first laser, comprising:

a substrate;

a fiber submount that is attached to said substrate and that includes a thermally insulating material having a thickness greater than 20 micrometers;

an optical component that is soldered to said fiber submount using heat from a second laser;

a fiber bonding pad located between said thermally insulating material and said optical component;

a laser submount attached to said substrate; and a first laser that is attached to said laser submount, whereby said first laser is substantially aligned with said optical component.

2. The optical connection module of claim 1 wherein said optical connection module is a fiber-coupled laser module and said optical component is an optical fiber.

3. The optical connection module of claim 1, wherein said fiber bonding pad and said thermally insulating material conduct heat locally during soldering to uniformly melt said solder.

4. The optical connection module of claim 1, wherein said thermally insulating material and said fiber bonding pad limit heat transfer to said substrate during soldering.

5. The optical connection module of claim 1, wherein said fiber bonding pad performs at least one of providing a solder dam, absorbing laser light, laterally conducting heat, and improving the strength of an attachment between said optical component and said substrate.

6. The optical connection module of claim 5 wherein said fiber bonding pad includes:

a first layer; and a second layer having one side connected to said first layer.

7. The optical connection module of claim 6 wherein said fiber bonding pad further includes a third layer having one side adjacent to said second layer.

8. The optical connection module of claim 7, wherein said third layer comprises Ti.

9. The optical connection module of claim 7 further comprising a fourth layer located between said second and third layers.

10. The optical connection module of claim 9 wherein said fourth layer comprises Pt.

11. The optical connection module of claim 6, wherein said first layer comprises Au.

12. The optical connection module of claim 6, wherein said second layer comprises a material that absorbs laser light.

13. The optical connection module of claim 6, wherein said second layer comprises a solder dam.

14. The optical connection module of claim 6, wherein said second Layer comprises a material selected from the group consisting of Ni, Cr, Ti, and CrO.

15. The optical connection module of claim 1 wherein said thermally insulating material is selected from the group of glass and ceramic.

16. The optical connection module of claim 1 wherein said molder is selected from the group of AuSn, PbSn and AuGe.

17. The optical connection module of claim 1, wherein said laser submount is comprised of a material selected from the group consisting of AlN, AlNi, SiC, BeO, TcBN, diamond and Si.

18. The optical connection module of claim 17 wherein said optical component is an active optical component.

19. The optical connection module of claim 17, wherein said optical component is a passive optical component.

20. The optical connection module of claim 1 wherein said optical component is selected from the group of optical fiber, mirrors, lenses, detectors, microelectromechanical (MEMS) devices, and isolators.

21. An optical connection module for attaching an optical component to a substrate and for aligning said optical component to a first laser, comprising:

a substrate;

a fiber submount attached to said substrate and including a fiber bonding pad and a thermally insulating material that has a thickness greater than 20 micrometers and wherein said fiber submount conducts heat locally during soldering to uniformly melt said solder and insulates heat transfer to said substrate;

an optical component that is soldered to said fiber bonding pad with heat that is produced by a second laser;

a laser submount that is attached to said substrate; and a first laser that is attached to said laser submount, whereby the first laser is substantially aligned with said optical component.

22. The optical connection module of claim 21 wherein said fiber bonding pad performs at least one of providing a solder dam, absorbing laser light, laterally conducting heat, and improving the strength an attachment between said optical component and said substrate.

23. The optical connection module of claim wherein said fiber bonding pad includes:

a first layer, and a second layer having one wide connected to said first layer.

24. The optical connection module of claim 23 wherein said fiber bonding pad includes a third layer having one side adjacent to said second layer.

25. The optical connection module of claim 24 wherein said third layer comprises Ti.

26. The optical connection module of claim 24 further comprising a fourth layer located between said second and third layers.

27. The optical connection module of claim 26 wherein said fourth layer comprises Pt.

28. The optical connection module of claim 23 wherein said first layer comprises Au.

29. The optical connection module of claim 23 wherein said second layer comprises a material that absorbs laser light.

30. The optical connection module of claim 23, wherein said second layer comprises a solder dam.

31. The optical connection module of claim 23, wherein said second layer comprises a material selected from the group consisting of Ni, Cr, Ti and CrO.

32. The optical connection module of claim 21 wherein said solder is selected from the group of AuSn, PbSn, and AuGe.

33. The optical connection module or claim 21 wherein said laser submount comprise a material selected from the group consisting of AlN, AlNi, SiC, TcBN, BeO, diamond and Si.

34. The optical connection module of claim 21 wherein said optical component is at least one of active and passive optical component.

35. The optical connection module of claim 21 wherein said optical component is selected from the group of optical fiber, mirrors, lenses, detectors, microelectromechanical devices, and isolators.

36. An integrated optical connection module for attaching an optical component to a substrate and for aligning said optical component to a first laser comprising:

a substrate;

a thermally insulating material formed integrally in said substrate and having a thickness greater than 20 micrometers;

a fiber bonding pad including at least one metallic layer attached to said thermally insulating material;

an optical component that is soldered to said fiber bonding pad; and a first laser located on said substrate, whereby the first laser is substantially aligned with said optical component.

37. The integrated optical connection module of claim 36 wherein said fiber bonding pad conducts heat locally during soldering to uniformly heat said solder using a second laser and insulates heat transfer from said solder to said substrate.

38. The integrated optical connection module of claim 36 wherein said fiber bonding pad performs at least one of providing a solder dam, absorbing laser light, laterally conducting heat, and improving the strength an attachment between said optical component and said substrate.

39. The integrated optical connection module of claim 36 wherein said fiber bonding pad includes:

a first layer; and a second layer having one side connected to said first layer.

40. The integrated optical connection module of claim 39 wherein said fiber bonding pad includes a third layer having one side adjacent to said second layer.

41. The integrated optical connection module of claim 40, wherein said third layer comprises Ti.

42. The integrated optical connection module of claim 40 further comprising a fourth layer located between said second and third layers.

43. The integrated optical connection module of claim 42, wherein said fourth layer comprises Pt.

44. The integrated optical connection module of claim 39, wherein said first layer comprises Au.

45. The integrated optical connection module of claim 39, wherein said second layer comprises a material that absorbs laser light.

46. The integrated optical connection module of claim 39, wherein said second layer comprises a solder dam.

47. The integrated optical connection module of claim 39, wherein said second layer comprises selected from the group consisting of Ni, Cr, Ti and CrO.

48. The integrated optical connection module of claim 36 wherein said thermally insulating material is selected from the group of glass and ceramic.

49. The integrated optical connection module of claim 36 said molder is selected from the group of AuSn, PbSn, and AuGe.

50. The integrated optical connection module of claim 36 wherein said thermally insulating material is attached to said substrate using anodic bonding.

51. The integrated optical connection module of claim 50 wherein at learnt one lateral gap that is formed between said substrate and said thermally insulating material is filled with glass frit.

52. The integrated optical connection module of claim 51 wherein said glass frit is annealed and polished.

53. The integrated optical connection module of claim 36 wherein said thermally insulating material is formed using flame hydrolysis.

54. The integrated optical connection module of claim 36, wherein the thermally insulating material is formed integrally in said substrate by patterning and etching a first region of the substrate.

* * * * *

UNITED STATES PATENT AND TRADEMARK OFFICE
CERTIFICATE OF CORRECTION

PATENT NO. : 6,758,610 B2
DATED : July 6, 2004
INVENTOR(S) : Ziari et al.

It is certified that error appears in the above-identified patent and that said Letters Patent is hereby corrected as shown below:

Column 7,
Line 54, "said molder is" should read -- said solder is --

Column 8,
Line 22, "of claim wherein" should read -- of claim 22 wherein --
Line 25, "one wide connected" should read -- one side connected --
Line 51, "submount comprise a" should read -- submount comprises a --

Column 10,
Line 15, "said molder" should read -- said solder --
Line 20, "at learnt one" should read -- at least one --
Line 25, "of claim 36" should read -- of claim 37 --

Signed and Sealed this

Nineteenth Day of April, 2005

JON W. DUDAS
*Director of the United States Patent and Trademark Office*